United States Patent Office 3,567,533

Patented Mar. 2, 1971

3,567,533

TIN SOLDER COATED WITH CHROMIUM AS A MASK FOR ETCHING A METAL BASE

John S. C. Chiang, Cranbury, N.J., and Joseph T. McManamon, Levittown, Pa., assignors to FMC Corporation, New York, N.Y.

No Drawing. Filed Feb. 20, 1969, Ser. No. 801,199
Int. Cl. C23f *1/00, 17/00*
U.S. Cl. 156—11 5 Claims

ABSTRACT OF THE DISCLOSURE

A method of etching a metal workpiece is described, which carries a tin resist (or a tin-coated solder resist); a chromate coating is provided over the resist, and the metal workpiece is etched with an aqueous etchant such as a peroxysulfate containing phosphoric acid or a sodium chlorite-ammonium hydroxide solution or a chromic-sulfuric acid bath to dissolve the metal free of resist, thus producing bright, smooth and electrically clean reliefs having sharp pattern definition on the metal workpiece.

BACKGROUND OF THE INVENTION

(A) Field of the invention

The field of invention is etching of metals. More particularly, the present invention relates to producing bright, smooth and electrically clean printed circuits with sharp pattern definition and excellent solderability characteristics.

(B) Description of the prior art

Methods have been developed for selectively dissolving or etching metal in the production of electrical printed circuits, printing plates or other metal products having predetermined raised portions or reliefs. In the production of printed circuits, for example, conductor metal foil (usually copper) is laminated to a plastic sheet or to a fiber sheet impregnated with a bonding material such as a phenolic resin; it is then masked with a removable resist material in areas which later become the circuit, and the masked conductor metal sheet is then subjected to attack by an etchant. The removable resist material, frequently an ink, a wax or a photographic emulsion, is not attacked by the etchant, and accordingly the conductor metal is dissolved preferentially in areas not coated by the removable resist. This produces a metal relief in the desired circuit pattern from which the resist may be removed.

Tin, solder and tin on solder coatings have come into use as etch resist materials in these selective etching processes and better results have been obtained. The tin or solder or tin on solder is applied to the conductor metals in the areas it is not desired to etch and upon etching these materials remain on the surface of the relief; it serves not only as a resist during etching but also facilitates the attachment of components, improves solderability and electrical contact.

The use of tin, solder and tin on solder coatings has led to some severe problems. Common etchants such as nitric acid or ferric chloride cannot be employed since they readily dissolve the tin or solder. The art has therefore used etchants which do not dissolve the tin, such as water-soluble peroxysulfates, as well as chromic-sulfuric acid baths and ammoniacal aqueous sodium chlorite solutions.

Practical experience with these non-dissolving etchants has indicated a number of disadvantages and shortcomings. Tin and solder are attacked slightly by these reagents, frequently causing a darkening and formation of powdery reaction products, which interfere with subsequent soldering operation. Furthermore, some byproducts slough off the solder or tin resist onto the adjacent metal conductor substrate, providing either an incomplete or a non-uniform etch. "Run-off" of this sort distorts pattern definition. In addition, the darkened appearance of the tin or solder-plated circuit is so unattractive that manufacturers of electronic circuits are reluctant to employ them.

Various after-treatments have been proposed to remove the deposits and discoloration. One means has been to treat the etched tin or solder with an aqueous hydrochloric acid solution to loosen the foreign matter, followed by mechanically abrading, e.g., wire brush or the like, to remove the loosened material. Since control of the operation is rather crude, the process has been generally unacceptable to the electronics trade. Another means is disclosed in U.S. Pat. 3,181,984, which involves an after-treatment with an aqueous solution of fluoboric acid and thiourea. This patented process, while being effective, is costly and toxic.

It therefore has remained desirable to provide a method of protecting tin and solder resist from attack by the etching solution and thereby avoiding the above-noted deleterious effects.

SUMMARY OF THE INVENTION

We have now found how to overcome the deficiencies normally associated with conventional etching of tin resisted workpieces. We have found that by providing a thin chromate coating on the surface of a tin resist (or a tin coated solder resist) on metal which is to be etched by an aqueous etchant which contains as essential ingredients either a peroxysulfate containing phosphoric acid, sodium chlorite-ammonium hydroxide or chromic-sulfuric acid, and by etching the resulting chromate coated workpiece with the above etchants until the metal has been etched in areas free of the resist to the desired extent, an etched metal workpiece having a relief which is bright, smooth, electrically clean and having sharp pattern definition is produced.

DESCRIPTION OF THE INVENTION AND THE PREFERRED EMBODIMENTS

In carrying out the process of our invention, a conventional backing board, e.g., a plastic sheet or a fiber sheet impregnated with phenolic resin, is provided with a conductor metal sheet bonded to its surface. Any materials which are commonly used as a removable masking material, such as waxes, inks, vinyl polymers, asphalt-based compounds, cellulosic base resins and other high polymer film-forming materials may be employed as temporary maskants for regions of the conductor metal which subsequently will be dissolved away. Preferably, a photosensitive coating (e.g. those derived from light sensitive cinnamic acid esters of polyvinyl alcohols or vinyl benzalacetophenones) is applied to the conductor metal surface. A photographic film pattern is employed to expose the non-image area—that area which will ultimately be the insulating area of the circuit board, while masking the image area—that area which will ultimately become the circuit pattern.

Where the photosensitive masking material is exposed to light, it is hardened and thus rendered relatively insoluble in various solvents that otherwise would readily dissolve the coating. The unhardened portion may be dissolved away with various organic solvents, such as toluene or xylene, leaving the exposed conductor metal corresponding to the ultimate circuit pattern. In some cases sliding contact areas of the exposed copper may then be coated with another metal such as nickel to provide a hard base which improves the durability of the final printed circuit. This metal coating is not considered as a part of the etch resist. This is followed by the application of a metallic etch resist, i.e., tin or tin on solder, to the exposed conductor metal areas. The solder and tin may be applied either by electroplating or by immersion dipping. After the tin is applied, the hardened photosensitive resist may be stripped. Strong polar solvents, e.g., ketones, trichloroethylene, methylene chloride, or the like, are employed as strippers.

The specimen is then water rinsed, dried and immersed into a chromating solution containing a water-soluble hexavalent chromium compound (as for example alkali chromate, alkali dichromate and chromium trioxide), a base (for example sodium hydroxide) and a conventional surface active agent. Drying can be accomplished either by air or baking.

The exposed conductor metal—that area which will ultimately be the insulating area—is chemically dissolved away with an etchant selected from either an aqueous peroxysulfate solution containing phosphoric acid or sodium chloride-ammonium hydroxide solutions or chromic-sulfuric acid solutions. These etchants are essential and must be used in conjunction with the present resist system to obtain the excellent results described herein.

The etching can take place either by conventional immersion or spray techniques. In the immersion etching process, the workpiece is immersed in the solution for the amount of time required to etch the exposed conductor metal. In the spray etching technique the etching solution is discharged from a spray nozzle under pressure and the sprayed solution impinges on the workpiece. The spray etching technique is preferred because it permits shorter etching time and a better quality etch. This is due primarily to the constant replacement of etchant in contact with the conductor metal and to the removal of the etchant containing a high concentration of the dissolved metal in immediate contact with the workpiece.

The preferred etchants, the water-soluble peroxy-sulfates, are essentially non-toxic, economical, less corrosive than either acid or alkaline etchants and are easily handled both as etchant solutions and in the disposal of wastes, since they produce essentially soluble reaction products. Furthermore, they dissolve a wide variety of conductor metals.

The aqueous peroxysulfate etching solution employed to dissolve the conductor metal foil contains from 5% to the solubility limit of an ammonium, sodium, potassium or lithium peroxymonosulfate or an ammonium, sodium, potassium, barium, lithium or strontium peroxydisulfate and preferably about 5 to 25% by weight, and 0.5 to 15% and preferably 2.0 to 3.0% by weight of orthophosphoric acid. The phosphoric acid may be introduced as a poly-acid (e.g., pyrophosphoric or superphosphoric acid, and the like), which in situ forms orthophosphoric acid. The preferred peroxysulfate for use in this process is ammonium peroxydisulfate. No critical operating temperature exists, it being essential only to avoid freezing or boiling of the etching solution. It has been found, however, that heated, e.g. about 35 to 65° C., catalyzed aqueous persulfate solutions dissolve metal somewhat more rapidly than do solutions at room temperature. The etching rate may be accelerated by the incorporation of mercuric chloride or other mercuric salts which may be added to the solution as a dissolution catalyst. These solutions are well known in the art and are fully described in U.S. Pat. 2,978,301.

Chromic acid-sulfuric acid solutions of the type suitable for treating or dissolving metals may be used in accordance with this invention. The solutions may have varying concentrations of chromic acid and sulfuric acid and may contain such acids in widely varying proportions. The concentration of chromic acid is generally between about 70 to 170 grams per liter expressed as chromium trioxide, preferably between about 90 to 150 grams per liter. In these solutions the concentration of sulfuric acid is generally within the range of about 150 to 400 grams per liter, more usually between about 200 to 350 grams per liter. The weight ratio of chromic acid to sulfuric acid is generally between about 1:1.6 to 1:3.7 with best results obtained in those solutions in which the ratio of chromic acid to sulfuric acid is between about 1:1.8 to 1:3.2.

The preparation of chromic acid-sulfuric acid solutions simply involves the dissolution of the reactants and additives in water at suitable temperatures, e.g., room temperature. The chromic acid may be introduced in its solid anhydrous form as chromium trioxide. The chromic acid component may also be introduced as water-soluble metal chromates, such as sodium dichromate and ammonium dichromate. Other functional additives, such as sodium sulfate, potassium sulfate, sodium chloride, borax, hexamethylenetetramine, cupric nitrate, may also be used to increase the rate of dissolution. Generally, the rate of dissolution increases with increasing solution temperature. The operating solution temperatures are generally within the range of about 35–80° C., preferably 40–65° C.

Ammoniacal aqueous solutions of sodium chlorite used in conjunction with the tin-chromate resist system also produce the high quality printed circuits herein described. The preparation of these solutions and conditions for carrying out etching procedures are known to the art and are fully described in U.S. Pat. 3,231,503. Operating temperatures are not critical and range from about 25° to 70° C. Although temperatures above 70° C. are operative for the etching solution, ammonia volatilizes at an impractically rapid rate above that temperature.

In the above-described embodiments of the invention, the tin-coating may be deposited on the metal or on the solder, by any conventional method such as electroplating, immersion plating, or electroless plating. If the tin is applied electrochemically, generally tin sulfate solutions and current densities 10 to 100 amperes per square foot, or tin fluoborate solutions and current densities 25 to 125 amperes per square foot, or other conventional tin baths are used. However, for circuit boards already solder-plated, the immersion process is preferred.

The rate of deposition of the tin decreases exponentially with time. The rate also depends on tin salt concentration in the solution and the bath temperature. Immersion times for tin plating when tin is applied directly to the conductor metal should range between 30 seconds and 20 minutes with a preferred range of 10 to 20 minutes. It has been found that the immersion for less than about 10 minutes does not deposit a tin thickness sufficient to protect the conductor metal base, using the recommended concentrations. On the other hand, prolonged immersion times result in tin formations more commonly referred to as treeing along the edges of the circuit pattern with subsequent loss of pattern definition. When tin is applied to solder, one atomic layer is sufficient and no appreciable residence time is required.

The water-soluble tin compounds which are particularly useful in carrying out the immersion tin plating are stannous chloride and potassium stannate. Tin having concentrations ranging from 0.2% to the solubility limit of the tin compound can be readily deposited from acid solutions at room temperature with an operable temperature range of between 25° C. and 95° C. using either hydrochloric, sulfuric or fluoboric acid. Hydrochloric acid is preferred. Other compounds may be added to the tinning bath, for example, thiourea and conventional surface active agents.

The chromate conversion coatings may be deposited on the tin substrate either by electroplating or by immersion. Electrochemical methods use current densities of 20 to 50 amperes per square foot and form films between 100 to 150 angstroms thick. The immersion process is preferred because of its simplicity and lower consumption of chromating materials. Furthermore, the thinner films, i.e., between 30 and 60 angstroms, provide resist systems with the best solderability characteristics. The deposition rate depends on the chromium compound concentration and the temperature of the chromating solution. For example, immersion time in the chromating bath having a concentration of 0.3% potassium chromate should be between 10 and 30 seconds with a preferred range between 10 and 20 seconds. If the chromating time is less than 10 seconds, not enough coating of protective value will be deposited. On the other hand, prolonged chromating decreases the solderability characteristics of the printed circuit.

The water-soluble hexavalent chromium compounds may be selected from alkali chromates such as ammonium chromate, sodium chromate, potassium chromate, alkali dichromates, such as ammonium dichromate, sodium dichromate, potassium dichromate, and chromium trioxide. The concentration of the chromium compound in the chromating solution is not critical and may vary from 0.3% to the solubility limit of the chromium compound. Other chemicals may be present in the chromating solution which promote the growth of the coating, increase the protection against etchant attack, and improve the solderability characteristics. Some of these growth-promoting compounds are conventional surfactants, trisodium phosphate and tetrapotassium peroxydiphosphate.

The bath temperatures of the tin and chromating solutions should not be maintained at high levels since this is undesirable from an equipment and handling point of view, and sufficient time advantages which might result are not present at such temperatures to render it desirable to operate above 100° C. A temperature range of 60° to 95° C. is preferred.

Surface active agents are added to the tin and chromating baths to improve the wettability of the coating solutions. Useful surface active agents are the nonionic types such as isooctyl phenyl polyethoxy phenol containing from 9 to 11 ethoxy groups, cationic types such as cetyl dimethyl amine oxide, triethanolamine hydrochloride, cetyl dimethyl hydroxyethyl ammonium bromide, and anionic types such as sodium or potassium alkyl benzene sulfonates in which the alkyl group contains from 8 to about 18 carbon atoms. Obviously other conventional wetting agents will be suitable.

The following examples will serve to illustrate further the process of the present invention but are not meant to limit it thereto. In the examples, all the parts are by weight.

EXAMPLE 1

A 0.0015 inch copper foil was bonded to a 0.625 inch thick phenolic resin-impregnated fiber backing board measuring 2 inches by 3 inches and coated with a polyvinyl cinnamate-based organic photoresist. A photographic negative was superimposed upon the test board to expose the non-image area corresponding to the insulating part of the circuit board. The test board was subjected to actinic radiation. The unhardened photosensitive resist was removed with xylene. Solder composed of 63% lead and 37% tin was electroplated onto the exposed copper forming the conductor pattern of the circuit. The solder-plated, unstripped test board was dipped into an immersion tin plate solution containing 2% stannous chloride, 12% (37%) hydrochloric acid and 0.2% of an isooctyl phenyl polyethoxy phenol containing from 9–11 ethoxy groups at a temperature maintained between 25° and 75° C. for one minute and then rinsed with tap water at 16° C. for 15 seconds. The hardened resist was stripped with methylene chloride.

The circuit board was dipped into a chromating solution containing 0.3% of potassium chromate, 1% of sodium hydroxide and 0.2% of an isooctyl phenyl polyethoxy phenol containing from 9–11 ethoxy groups at a temperature between 60° C. and 98° C. for 10 seconds and then rinsed with tap water at 16° C. for 15 seconds and dried with forced air.

The resulting composite was etched in 20% solution of ammonium peroxydisulfate containing 5 p.p.m. dissolved mercury and 2.5% of 85% phosphoric acid maintained at about 35° to 46° C.

The resulting printed circuit was smooth, bright, had sharp pattern definition, and was electrically clean. The term electrically clean indicates that the surface of the circuit pattern was free of any deposits which would interfere with electrical contact, increase resistance between conductors or eventually cause corrosion.

To evaluate solderability of the printed circuit, a common testing procedure conforming to the Institute of Printed Circuits Edge Dip Solderability Test Standard was employed. Essentially, this test consists of dipping a fluxed part into molten solder for a given time and then evaluating the fresh solder coating by visual means. The flux usually specified is 25% by weight of water-white rosin dissolved in American Chemical Society-grade isopropyl alcohol. The solder is 60/40 tin-lead maintained at 232° C. and the time of immersion in solder is 2 to 5 seconds or long enough for the specimen to attain the solder bath temperature. If the surfaces to be soldered do not shown a clean, smooth, bright coating of solder over at least 95% of the area after immersion and removal of flux residues, the surface is not considered acceptable.

The printed circuits specimen of this example had excellent solderability characteristics.

A number of examples are given below for the purposes of illustration. Only a few of the combinations and permutations are specifically mentioned, and it is not the purpose of these examples to limit the scope of the invention.

Examples 2, 3 and 4 are directed to different aqueous etchants which are suitable for use with the tin-chromate resist systems. In these examples, the procedure of Example 1 was followed except for the substitution of the etchant. The resulting circuit boards had the same excellent qualities as that described in Example 1.

EXAMPLE 2

The etching solution contained 12% solution of potassium acid peroxymonosulfate containing 5 p.p.m. dissolved mercury and 2.5% of 85% phosphoric acid and was maintained at 43° C.

EXAMPLE 3

An aqueous solution containing 33% sodium chlorite, 10% ammonium hydroxide and 12% ammonium bicarbonate was used as the etchant. The temperature of the etching bath was about 40° C.

EXAMPLE 4

A chromic acid-sulfuric acid aqueous solution containing 21% chromium oxide, 16% sulfuric acid and 4% sodium disulfate was employed as the etching solution at a temperature of about 37° C.

Examples 5, 6 and 7 are directed to the various chromating solutions which are useful in applying a chromate conversion according to this invention. In these examples, the procedure of Example 1 was followed except for the substitution of the chromating solution.

EXAMPLE 5

An aqueous solution containing 0.3–0.5% sodium dichromate, 1% sodium hydroxide and 0.2% isooctyl phenyl polyethoxy phenol containing from 9–11 ethoxy groups was employed as the chromating solution. The bath temperature was held between 65–95° C. and the immersion time of the specimen was between 10–30 seconds. The resultant circuit patterns were bright, clean, had sharp pattern definition and excellent solderability characteristics.

EXAMPLE 6

The chromating bath consisted of 0.3–0.5% sodium chromate, 1% sodium hydroxide, 0.5% trisodium phosphate and 0.05% isooctyl phenyl polyethoxy phenol containing from 9–11 ethoxy groups in an aqueous solution. This chromating solution was maintained at a temperature of 60–98° C. and the immersion time was between 10–30 seconds. The resulting circuit board was equivalent when compared to that obtained in Example 1.

EXAMPLE 7

An aqueous solution containing 0.3–0.5% chromium trioxide, 1% sodium hydroxide and 0.2% isooctyl phenyl polyethoxy phenol containing from 9–11 ethoxy groups was used as the chromating bath. The temperature was held between 65–95° C. and the immersion time of the specimen was between 10–30 seconds. This specimen after etching gave the same excellent results characteristic of this invention.

The following examples are directed to tin resists:

EXAMPLE 8

An unstripped circuit board with copper foil exposed in the pattern of the desired circuitry was prepared for tinning by immersing in a 15% ammonium peroxydisulfate containing 5% sulfuric acid for one minute at room temperature. The board was rinsed, dried and dipped into a tin-plating bath containing 2% stannous chloride, 8% thiourea, 12% (37%) hydrochloric acid and 0.2% isoctyl phenyl polyethoxy phenol containing from 9–11 ethoxy groups for 10–20 minutes. The panel was rinsed with tap water at 16° C. for 10 seconds and then warm water at 38° C. for 10 seconds and dried.

The hardened resist was stripped with solvent. After stripping, the panel was chromated in a solution of 0.3 to 0.5% potassium chromate, 1% of sodium hydroxide and 0.2% of isooctyl phenyl polyethoxy phenol containing from 9–11 ethoxy groups.

The resulting circuit board was spray etched at 43° C. with a 20% ammonium peroxydisulfate solution containing 5 p.p.m. dissolved mercury and 2.5% by weight of (85%) phosphoric acid. The finished printed circuit gave bright and clean conductor patterns with sharp pattern definition.

The following examples show the tin-chromate resist system on other conductor metals. After etching, the specimens of these examples were subjected to the Edge Dip Solderability Test described above and all yielded the same excellent results as Example 1. If desired, solder may be applied as an initial resist to any of the conductor metals with the same advantages as obtained with copper; however, the following examples are devoid of solder.

EXAMPLE 9

Example 8 was repeated substituting beryllium-copper (97.4% copper, 1.9% beryllium, 0.4% cobalt, 0.1% iron and 0.2% silicone) for copper.

EXAMPLE 10

The method of Example 8 was repeated except the metal used was brass (80% copper and 20% zinc).

EXAMPLE 11

The method of Example 8 was employed; the metal used was bronze (90% copper and 10% tin).

EXAMPLE 12

Example 8 was repeated with copper-nickel-zinc alloy (65% copper, 18% nickel and 17% zinc).

EXAMPLE 13

Steel 1010 required a tinning solution containing 5.0% stannous sulfate, 10% sulfuric acid (0.2% surfactant)

and a solution temperature of 83° C. to 100° C.; otherwise the procedure of Example 8 was followed.

EXAMPLE 14

The method of Example 13 was repeated, in this instance employing a nickel-iron alloy (54% iron, 29% nickel and 17% cobalt).

EXAMPLE 15

The process of Example 13 was followed again, employing zinc as the conductor metal and modifying the tinning formulation by using 5.2% stannous sulfate, 10% sulfuric acid and 0.2% gelatin.

While the preferred embodiments of the invention are directed to the etching with copper, it should be noted that the present invention can be utilized to process iron, nickel, zinc, cobalt, magnesium, alloys of these metals, i.e., mild steel, kovar (nickel-cobalt-iron) and copper alloys, i.e., brass, bronze, beryllium-copper and nickel-zinc-copper.

The method is particularly useful in the manufacture of printed circuits but is not limited thereto. For example, useful applications are found in the preparation of relief patterns such as scales, nameplates, printing plates; in metallurgical applications, such as chemical milling, chemical polishing and for decorative items and the like.

Pursuant to the requirements of the patent statutes, the principle of this invention has been explained and exemplified in the manner so that it can be readily practiced by those skilled in the art, such exemplification, including that which is considered to represent the best embodiment of the invention. However, it should be clearly understood that within the scope of the appended claims, the invention may be practiced by those skilled in the art and having the benefit of this disclosure, otherwise and as specifically described and exemplified herein.

What is claimed is:

1. Method of etching a metal which carries an etch resist selected from the group of tin and tin-coated solder with an aqueous etchant selected from the group consisting of:

(a) peroxysulfate containing phosphoric acid,
(b) sodium chlorite-ammonium hydroxide, and
(c) chromic-sulfuric acid, comprising providing a chromate coating on said resist, and contacting the resisted coated metal with said etchant until the metal in areas free of said resist has been etched to provide a bright, smooth and electrically clean relief having sharp pattern definition.

2. The method of claim 1 in which the chromate coating is deposited on said resist from an aqueous alkaline solution of a hexavalent chromium compound selected from the group consisting of an alkali chromate, an alkali dichromate and chromium trioxide.

3. The method of claim 1 in which the peroxysulfate is ammonium peroxydisulfate.

4. The method of claim 1 in which the metal being etched is selected from the group consisting of cobalt, copper, iron, magnesium, nickel, zinc and alloys of these metals.

5. The method of claim 1 in which the metal is copper.

References Cited

UNITED STATES PATENTS

| | | | |
|---|---|---|---|
| 3,135,638 | 6/1964 | Cheney et al. | 156—11 |
| 3,236,708 | 2/1966 | Tillis | 156—11 |

JACOB H. STEINBERG, Primary Examiner

U.S. Cl. X.R.

156—3; 252—79.2, 79.5